United States Patent
Lin

(10) Patent No.: US 11,862,864 B2
(45) Date of Patent: Jan. 2, 2024

(54) LOW-LOSS TRUE TIME-DELAY PHASE SHIFTER

(71) Applicant: Analog Devices, Inc., Wilmington, MA (US)

(72) Inventor: Hsin-Chang Lin, Portland, OR (US)

(73) Assignee: Analog Devices, Inc., Wilmington, MA (US)

(*) Notice: Subject to any disclaimer, the term of this patent is extended or adjusted under 35 U.S.C. 154(b) by 89 days.

(21) Appl. No.: 17/546,879

(22) Filed: Dec. 9, 2021

(65) Prior Publication Data

US 2022/0231411 A1 Jul. 21, 2022

Related U.S. Application Data

(60) Provisional application No. 63/137,918, filed on Jan. 15, 2021.

(51) Int. Cl.
*H03H 11/22* (2006.01)
*H03H 11/36* (2006.01)
*H01Q 3/26* (2006.01)

(52) U.S. Cl.
CPC .......... *H01Q 3/2694* (2013.01); *H03H 11/22* (2013.01); *H03H 11/362* (2013.01)

(58) Field of Classification Search
CPC ...... H03H 11/22; H03H 11/362; H03H 11/20; H03H 11/16; H01P 1/18
See application file for complete search history.

(56) References Cited

U.S. PATENT DOCUMENTS

| 8,264,300 | B2 * | 9/2012 | Cisco | H01P 9/00 |
| | | | | 333/164 |
| 9,647,331 | B2 | 5/2017 | Manry, Jr. et al. | |
| 10,075,159 | B1 * | 9/2018 | Birkbeck | H03K 5/01 |

(Continued)

FOREIGN PATENT DOCUMENTS

| CN | 218301365 U | 1/2023 |
| DE | 202022100018 U1 | 4/2022 |

OTHER PUBLICATIONS

Shlafman et al., *Variable Delay Transmission Lines in Advanced CMOS SOI Technology*, 2014 IEEE Radio Frequency Integrated Circuits Symposium, 4 pages.

(Continued)

*Primary Examiner* — John W Poos
(74) *Attorney, Agent, or Firm* — Schwegman Lundberg & Woessner, P.A.

(57) ABSTRACT

Systems, devices, and methods related to phase shifters are provided. An example true time-delay (TTD) phase shifter structure includes a signal conductive line disposed on a first layer of the structure; a first switchable ground plane comprising a first conductive plane disposed on a second layer of the structure; a second switchable ground plane comprising a second conductive plane disposed on a third layer of the structure, where the first, second, and third layers are separate layers of the structure; a first switch coupled between the first switchable ground plane and a first ground element, the first ground element disposed on the second layer; and a second switch coupled between the second switchable ground plane and a second ground element, the second ground element disposed on the third layer.

20 Claims, 10 Drawing Sheets

(56) References Cited

U.S. PATENT DOCUMENTS 10,284,165 B2 * 5/2019 Onaka .................. H03H 7/20

OTHER PUBLICATIONS

Lee et al., *Ka-band 5-bit TTD Phase Shifter with Miniaturized Equivalent Delay Lines*, 2019 IEEE, 978-1-7281-3516-8, 3 pages.

Park et al., *A 15-40 GHz CMOS True-Time Delay Circuit for UWB Multi-Antenna Systems*, IEEE Microwave and Wireless Components Letters, vol. 23, No. 3, Mar. 2013, 3 pages.

Ma et al., *A 10-50GHz True-Time Delay Phase Shifter with max 3.9% delay variation*, 2014 IEEE Radio Frequency Integrated Circuits Symposium, 4 pages.

* cited by examiner

LOW-LOSS TRUE TIME-DELAY PHASE SHIFTER

CROSS REFERENCE TO RELATED APPLICATIONS

The present application claims priority to and the benefit of the U.S. Provisional Patent Application No. 63/137,918 entitled "LOW-LOSS TRUE TIME-DELAY PHASE SHIFTER" and filed Jan. 15, 2021, which is hereby incorporated by reference in its entirety as if fully set forth below and for all applicable purposes.

TECHNICAL FIELD OF THE DISCLOSURE

The present disclosure generally relates to electronics, and, more specifically, to low-loss true time-delay (TDD) phase shifters (e.g., in phased array systems).

BACKGROUND

Phase shifters are commonly used in high-frequency systems, in particular, in millimeter wave bands, for signal adjustments and/or beamforming. Some example systems and/or devices that utilize phase shifters may include wireless communication systems, such as Long Term Evolution (LTE) and $5^{th}$ generation (5G), which transmit and receive signals in the form of electromagnetic waves in the radio frequency (RF) range of approximately 3 kiloHertz (kHz) to 300 gigaHertz (GHz). For example, a wireless communication system may utilize a phased array antenna system (which may also be referred to as an electrically steerable array (ESA)) for wireless transmission and reception. A phased array antenna system may include an array of antenna elements (e.g., about 64, 128, 256, 1024 or more). The directivity of the phased array antenna system can be achieved by adjusting the relative phases between signals transmitted or received by different antenna elements. These antenna elements can direct the transmitted or received radiation in a desired spatial direction.

Phase shifts can be achieved by utilizing TTD lines or phase shifters. TTD lines can delay all frequency components by the same amount of time, whereas phase shifters can delay some frequency components longer than others causing beam squint issues. Thus, in some scenarios, it may be desirable to utilize TTD lines to provide phase shifts rather than phase shifters. Accordingly, technique improvements for providing TTD-based phase shifters may be desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
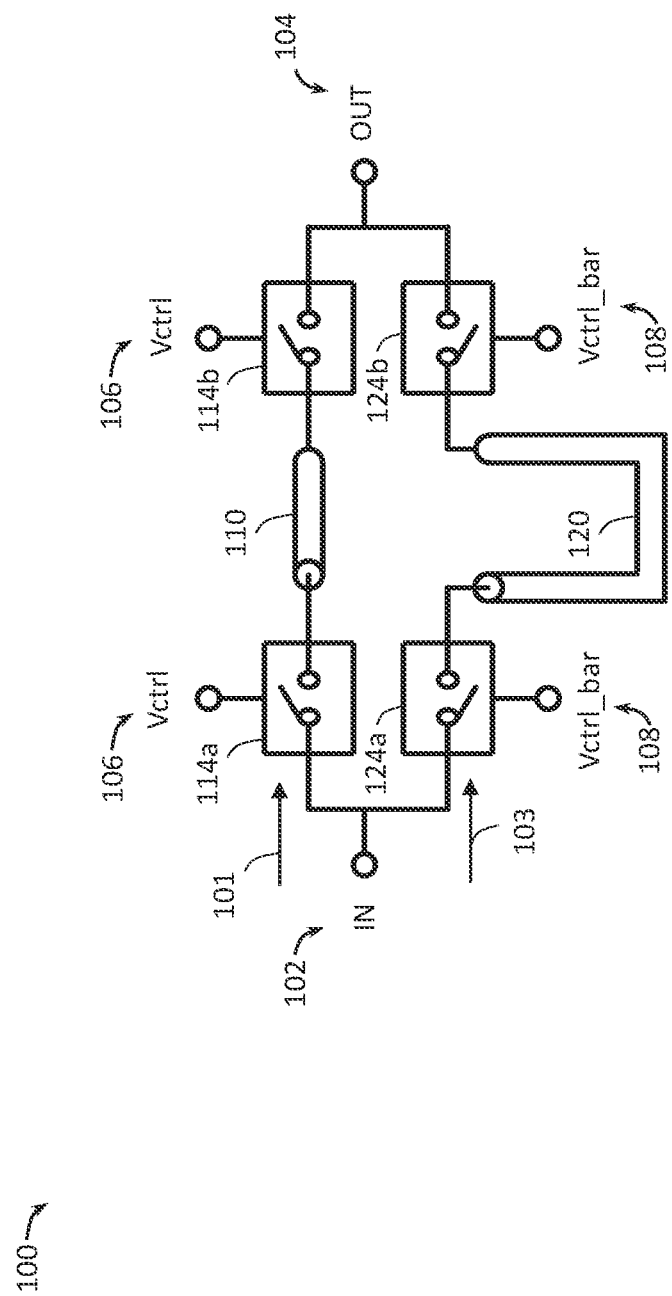
FIG. 1 is schematic diagram illustrating an exemplary true time-delay (TTD) phase shifter with switchable transmission lines.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

TTD phase shifters are commonly implemented using switched transmission lines. To that end, a TTD component may include, for example, two transmission lines of different lengths to provide a reference signal path (via the shorter transmission line) and a delayed signal path (via the longer transmission line). The TTD component may also include switches to select between the two transmission lines. By switching to the different paths, a phase shift proportional to the additional transmission line length can be achieved. One disadvantage with using switched transmission lines is that the insertion loss can be high (e.g., due to the longer transmission line used for providing the longer delay). In some examples, the insertion loss for switched transmission lines can be about 10-15 decibels (dBs) when operating in a frequency range of about 30-40 GHz. Further, the linearity of switched transmission lines-based TTD phase shifter can be limited by the nonlinearity of switches that are used to switch between the transmission lines.

The present disclosure describes mechanisms for providing TTD phase shifters in a manner that can address the insertion loss and linearity issues discussed above. One aspect of the present disclosure provides a TTD phase shifter using a microstrip transmission line with switchable ground planes to achieve a low insertion loss and a high linearity (e.g., an infinite linearity). For example, a TTD phase shifter structure may include a signal conductive line disposed on a first layer of the structure. The TTD phase shifter structure may further include at least a first switchable ground plane including a first conductive plane (e.g., a metal sheet) disposed on a second layer of the structure and a second switchable ground plane (e.g., another metal sheet) including a second conductive plane disposed on a third layer of the structure. The first, second, and third layers are different or separate layers (e.g., separate conductive layers or metal layers) of the structure. Each of the first switchable ground plane and the second conductive planes can be switched between a ground state or a floating state. At any given time, the first switchable ground plane or the second switchable ground plane can be switched to a ground state and the other one of the first switchable ground plane or the second switchable ground plane can be switched to a floating state. To that end, the TTD structure may further include a plurality of switches to selectively switch one of the first switchable ground plane or the second switchable ground plane to the respective ground state and the other one of the first switchable ground plane or the second switchable ground plane to the respective floating state. For instance, a first switch of the plurality of switches may be coupled between the first switchable ground plane and a first ground element that is disposed on the second layer. Similarly, a second switch of the plurality of switches may be coupled between the second switchable ground plane and a second ground element that is disposed on the third layer In some aspects, the first, second, and third layers are spaced apart from each other vertically (e.g., above or below one another). For instance, the second layer including the first switchable ground plane may be below the first layer including the signal conductive line by a first distance, and the third layer including the second switchable ground plane may be below the second layer. Further, each of the first switchable ground plane and the second switchable ground plane may at least partially overlap with the signal conducting line to provide a return path for a signal travelling through the signal conductive line. Because the signal conductive line is closer to the first switchable ground plane than the second switchable ground plane, a larger capacitance (e.g., parasitic capacitance) may be generated when the first switchable ground plane is switched to a ground state (to operate as a ground plane for the signal conductive line) than when the second switchable ground plane is switched to a ground state (to operate as a ground plane for the signal conductive line). The speed of signal propagation may be dependent on (or counter-proportional to) the capacitance. For instance, the larger the capacitance, the slower the signal propagation speed. Because the first switchable ground plane can generate a larger capacitance than the second switchable ground plane, the first switchable ground plane can provide an increased delay compared to the second switchable ground plane. Thus, in some instances, the second switchable ground plane can be referred to as a reference ground plane, and the first switchable ground plane can be referred to as a slow-wave ground plane. Stated differently, when the first switchable ground plane is in a float stating and the second switchable ground plane is in a ground state, the TTD phase shifter structure may operate in a reference mode. Conversely, when the first switchable ground plane is in a ground state and the second switchable ground plane is in a floating state, the TTD phase shifter structure may operate in a slow mode or delayed mode.

In some aspects, to further increase a delay difference between the first and the second switchable ground planes, the first conductive plane (of the first switchable ground plane) may be configured with a slow-wave structure. For instance, the first conductive plane may include a first elongated conductive segment, a second elongated conductive segment, and a plurality of elongated conductive segments spaced apart from each other, where opposite ends of each of the plurality of elongated conductive segments are each connected to a different one of the first elongated conductive segment or the second elongated conductive segment. To couple the slow-wave structure (the first switchable ground plane) to the first ground element, the first switch can be arranged between the first or second elongated conductive segment and the first ground element. Further, the first switchable ground plane can be arranged such that a signal propagation axis of the signal conductive line is non-parallel (e.g., about perpendicular) with a signal propagation axis of the plurality of elongated conductive segments of the slow-wave structure to provide the increased delay.

In some aspects, the plurality of switches for switching the first switchable ground plane between a ground state and a floating state and the second switchable ground plane between a ground state and a floating state may be implemented using field-effect transistors (FETs). In some aspects, the first switch (coupled between the first switchable ground plane and the first ground element) and the second switch (coupled between the second switchable ground plane and the second ground element) can be sized to the insertion loss variation between the reference mode and the delayed mode. In some aspects, the TTD phase shifter structure can further include a capacitor connected in parallel with the second switch, for example, coupled between the second switchable ground plane and the second ground element to further increase (or enhance) the time delay when a signal is travelling in the delayed mode.

In some aspects, the TTD phase shifter may be integrated as part of a multi-bit phase shifter, as part of a beamforming integrated device, and/or as part of a phase antenna array system.

The systems, schemes, and mechanisms described herein advantageously provide TTD phase shifters with a lower insertion loss and a higher linearity (e.g., an infinite linearity) by utilizing switchable ground planes to provide different transmission delays instead of switched transmission lines. Further, utilizing a microstrip transmission line topology (where the first and second switchable ground planes are vertically stacked with the signal conductive line) can allow for a reduced die area compared to a coplanar waveguide topology.

Example Switched Transmission Line-Based TTD Phase Shifter

FIG. 1 is schematic diagram illustrating an exemplary TTD phase shifter 100 with switched transmission lines. The TTD phase shifter 100 may be part of an integrated circuit device. In some instances, the TTD phase shifter 100 may be part of a multi-bit phase shifter. In some instances, the TTD phase shifter 100 may be part of a radio frequency (RF) device. The TTD phase shifter 100 may utilize a switched transmission line topology to provide two different output delay states or modes (e.g., a reference state or reference mode and a delayed state or delayed mode).

As shown, the TTD phase shifter 100 may include an input node 102, an output node 104, a first signal path 101 arranged between the input node 102 and the output node 104, and a second signal path 103 arranged between the input node 102 and the output node 104. The first signal path 101 may include a transmission line 110, a switch 114a coupled between the transmission line 110 and the input node 102, and another switch 114b coupled between the transmission line 110 and the output node 104. The switches 114a and 114b may each be controlled by (or responsive to)

a first control signal 106 (shown as Vctrl). For instance, a switch 114 may be switched on when the first control signal 106 is a logic high and may be switched off when the first control signal 106 is a logic low. In some aspects, the switches 114 may be implemented as FETs or any suitable types of transistors.

The second signal path 103 may include another transmission line 120, a switch 124a coupled between the transmission line 120 and the input node 102, and another switch 124b coupled between the transmission line 120 and the output node 104. As shown, the transmission line 120 may have a longer length than the transmission line 110. Accordingly, a signal may take a longer time to travel through the transmission line 120 than the transmission line 110, and thus providing a delay in time. The switches 124a and 124b may each be controlled by (or responsive to) a second control signal 108 (shown as Vctrl_bar). The second control signal 108 may be an inverted signal of the first control signal 106 so that a single one of the first signal path 101 or the second signal path 103 may be selected at any given time. In other words, the TTD phase shifter 100 may be configured to transmit an input signal via the transmission line 110 with a first transmission delay or via the transmission line 120 with a second transmission delay greater than the first transmission delay. In some aspects, the switches 124 may also be implemented as FETs or any suitable types of transistors.

As explained above, TTD phase shifters that utilize switched transmission lines may have a high insertion loss and a limited linearity. Accordingly, the present disclosure provides techniques to implement a TTD phase shifter using switchable ground planes to overcome the insertion loss and linearity issues with the switched transmission line topology.

Figure 2A:
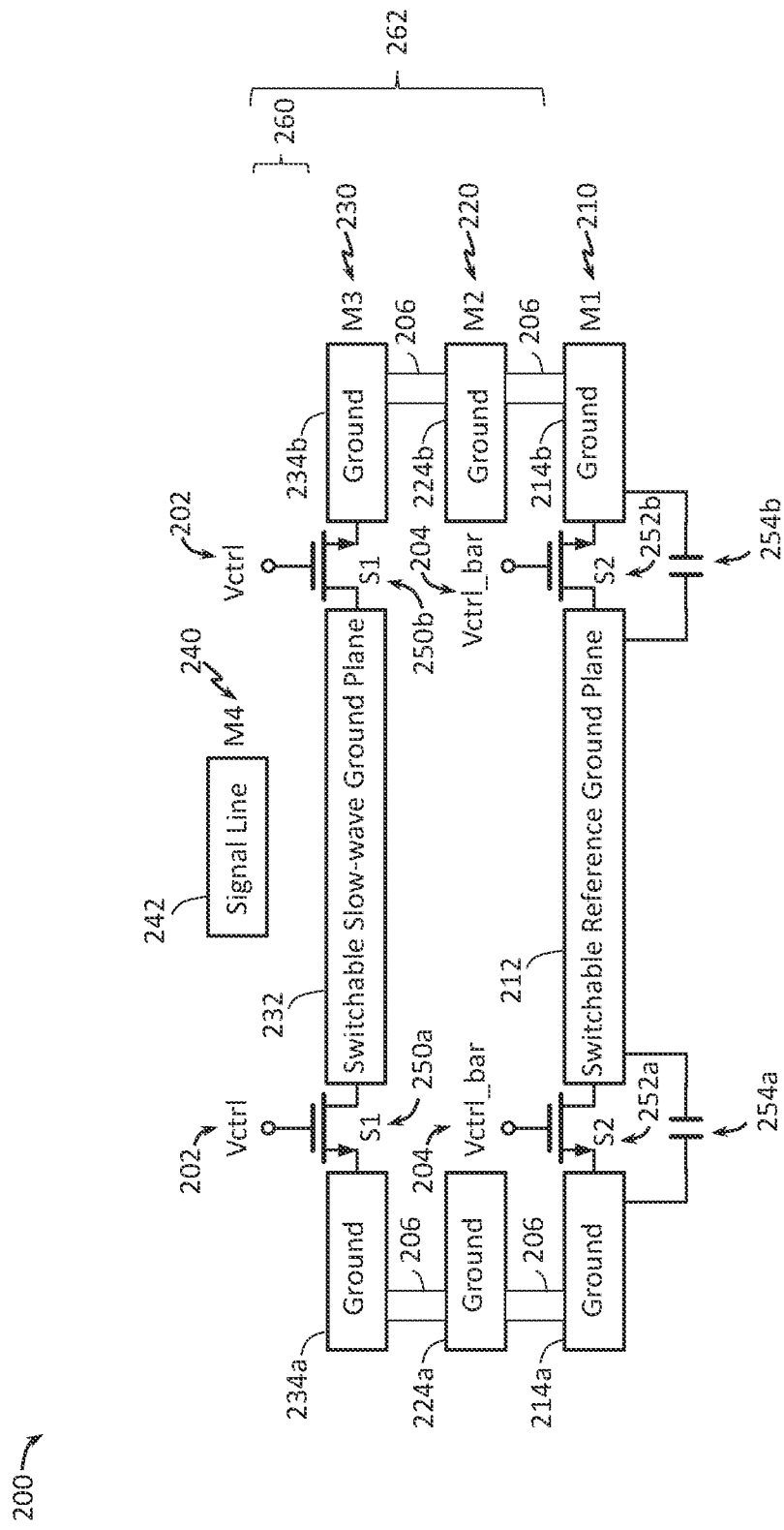
FIG. 2A is a cross-sectional view of an exemplary TTD phase shifter structure with switchable ground planes, according to some embodiments of the present disclosure.
Figure 2B:
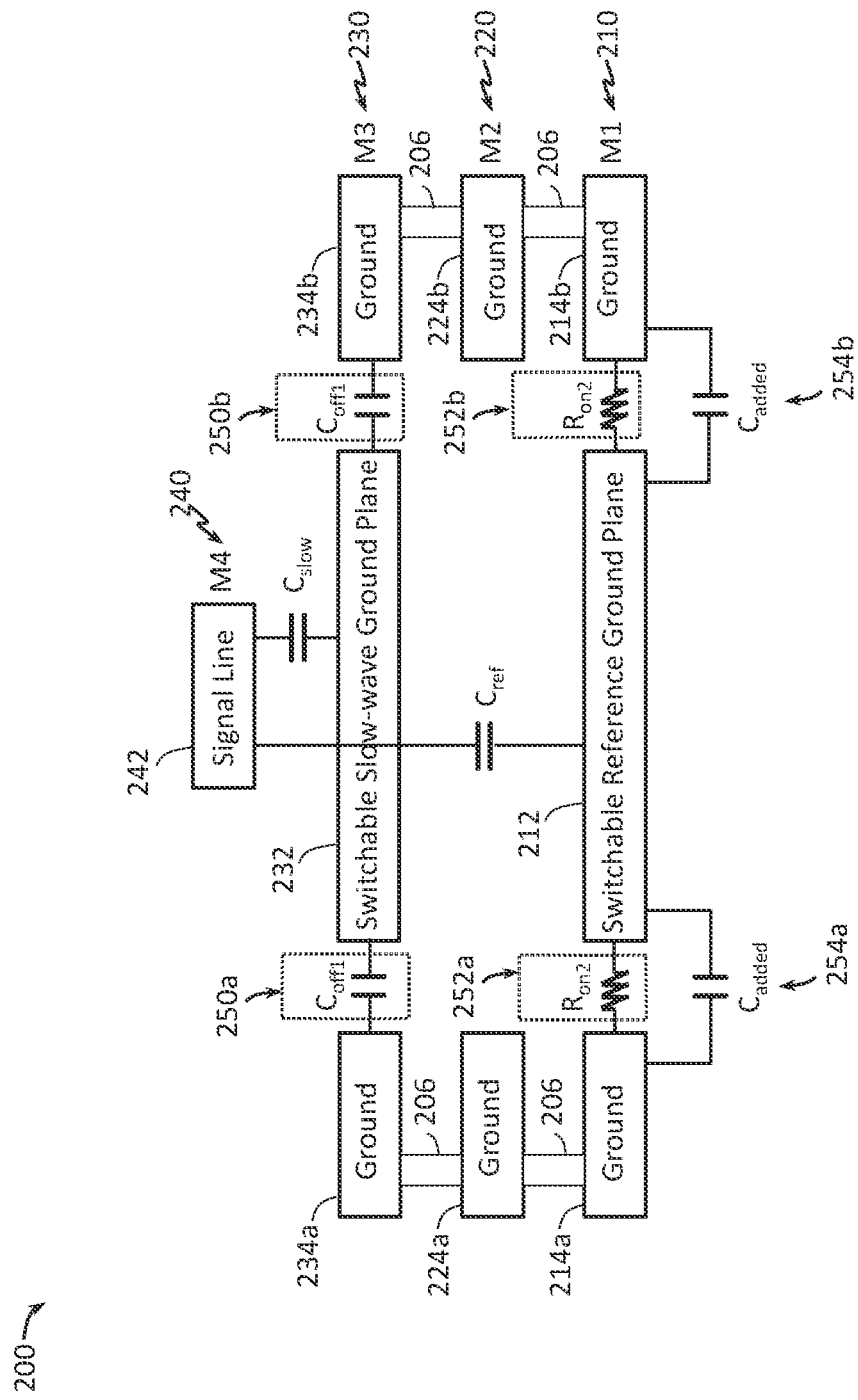
FIG. 2B illustrates an equivalent model of an exemplary TTD phase shifter structure with switchable ground planes operating in a reference mode, according to some embodiments of the present disclosure.
Figure 2C:
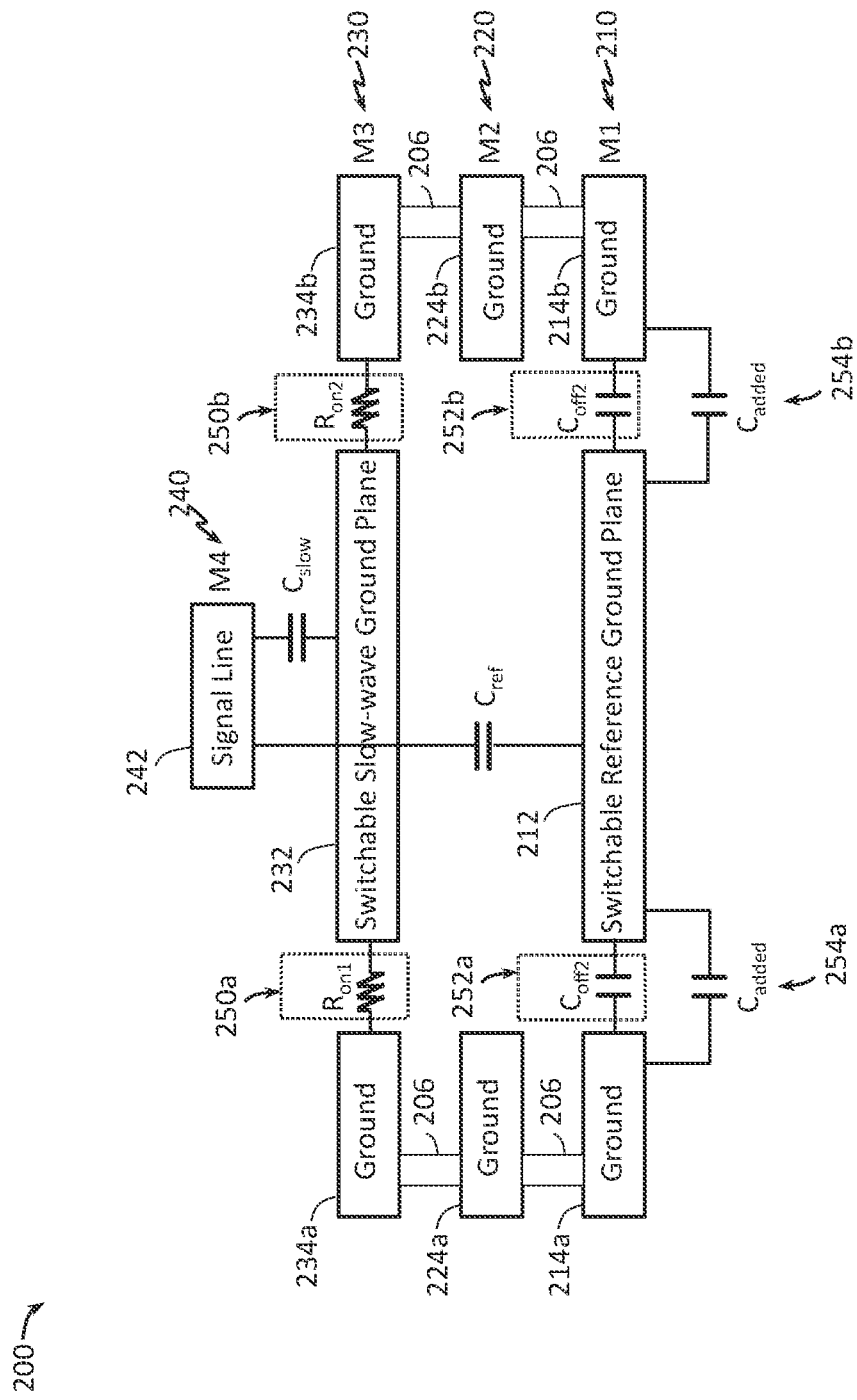
FIG. 2C illustrates an equivalent model of an exemplary TTD phase shifter structure with switchable ground planes operating in a delayed mode, according to some embodiments of the present disclosure.
Figure 3B:
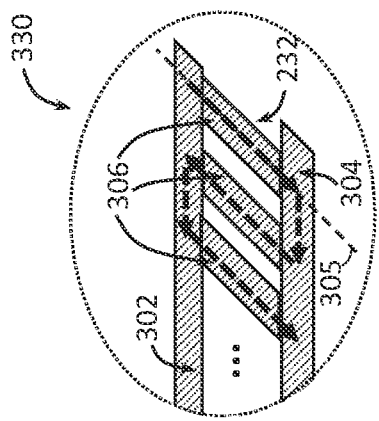
FIG. 3B illustrates an expanded view of a portion of a switchable slow-wave ground plane, according to some embodiments of the present disclosure.
Figure 3C:
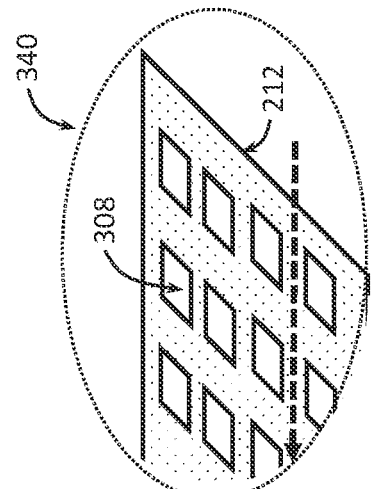
FIG. 3C illustrates an expanded view of a portion of a switchable reference ground plane, according to some embodiments of the present disclosure.
Figure 3A:
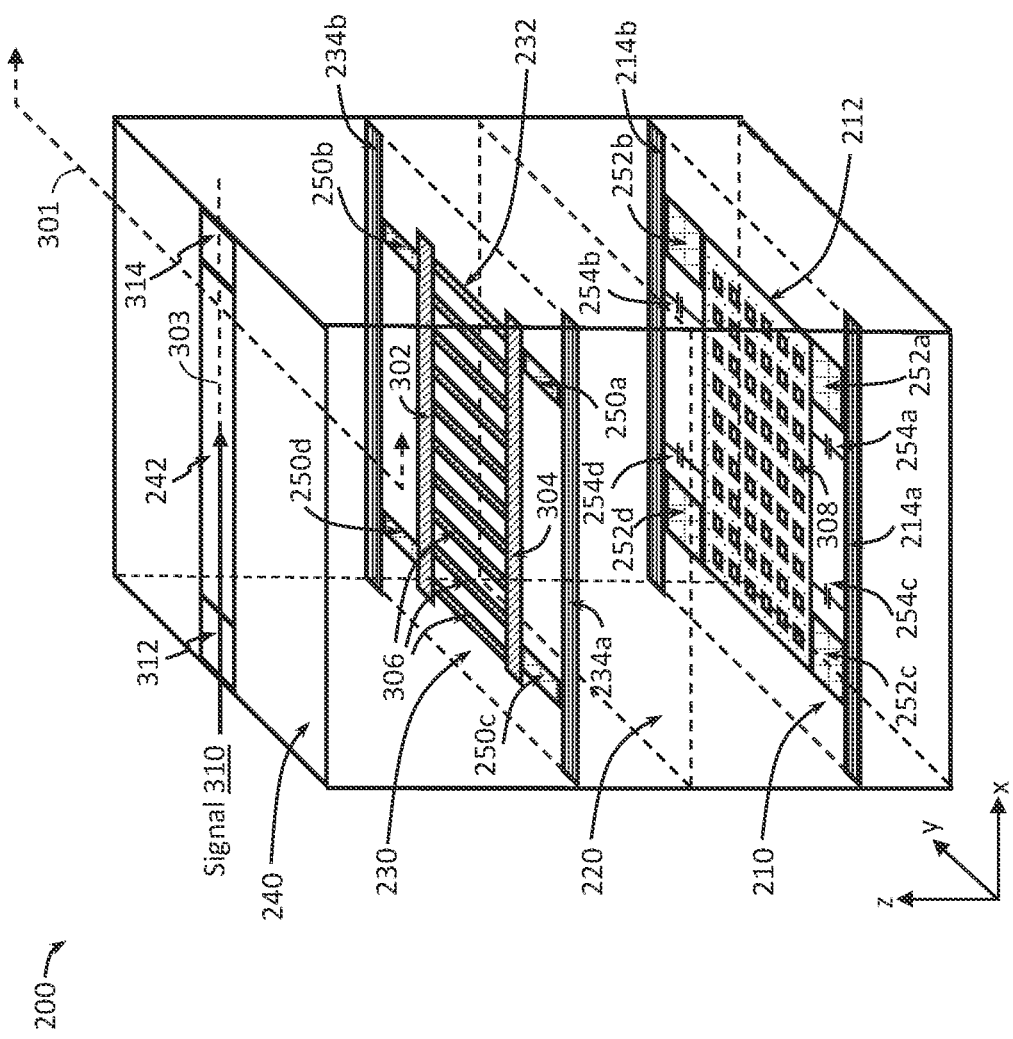
FIG. 3A is a perspective view of an exemplary TTD phase shifter structure with switchable ground planes, according to some embodiments of the present disclosure.
Figure 4:
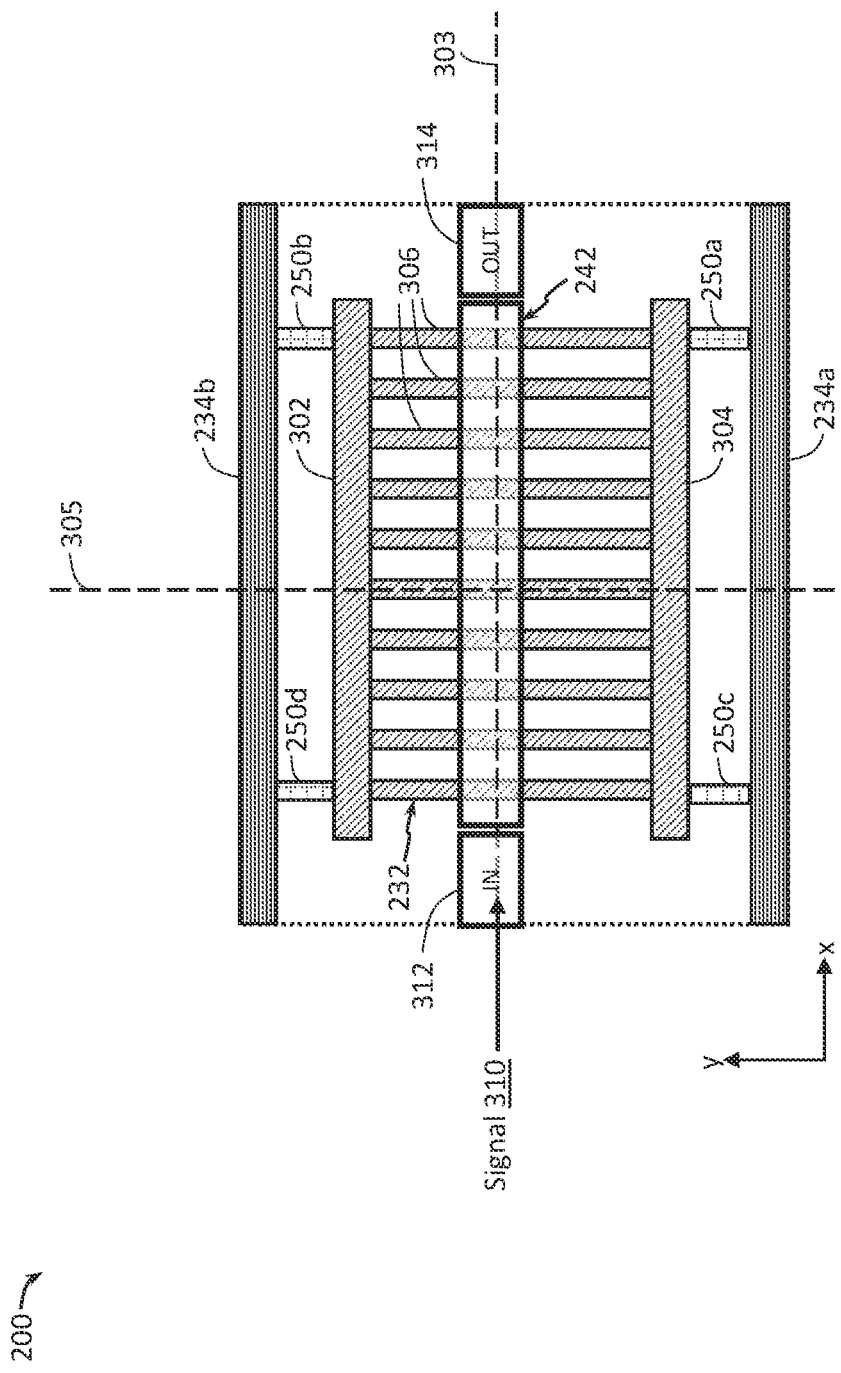
FIG. 4 is a top view of an exemplary TTD phase shifter structure with switchable ground planes, according to some embodiments of the present disclosure.
Figure 5:
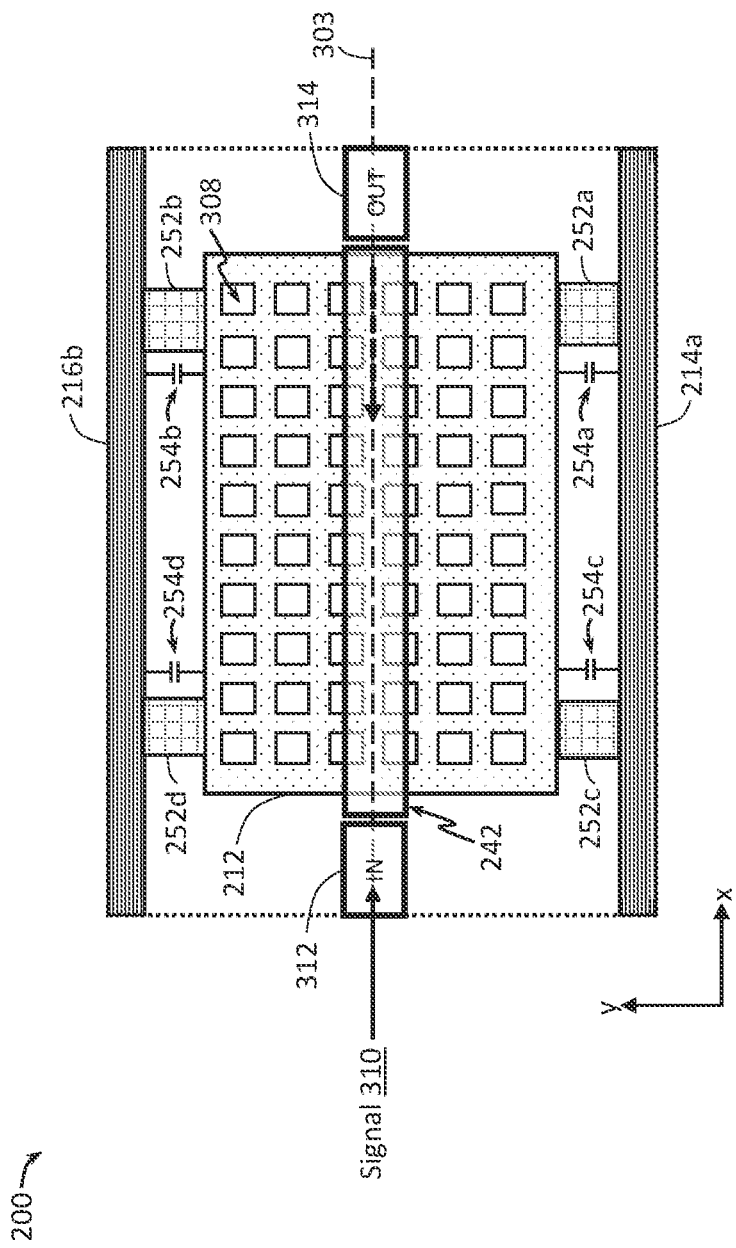
FIG. 5 is a top view of an exemplary TTD phase shifter structure with switchable ground planes, according to some embodiments of the present disclosure.

Example Low-Loss, High-Linearity Switchable Around Plane-Based TTD Phase Shifter FIGS. 2A-2C, 3A-3C, and 4-5 are discussed in relation to each other to illustrate a low-loss, high-linearity TTD phase shifter structure that utilizes a microstrip transmission line with tunable or switchable ground planes to provide selectable delays. FIG. 2A is a cross-sectional view of an exemplary TTD phase shifter structure 200 with switchable ground planes (e.g., a switchable reference ground plane 212 and a switchable slow-wave ground plane 232), according to some embodiments of the present disclosure. FIG. 2B illustrates an equivalent model of the TTD phase shifter structure 200 operating in a reference mode, according to some embodiments of the present disclosure. FIG. 2C illustrates an equivalent model of the TTD phase shifter structure 200 operating in a delayed mode, according to some embodiments of the present disclosure. FIG. 3A is a perspective view of the TTD phase shifter structure 200, according to some embodiments of the present disclosure. FIG. 3B illustrates an expanded view 330 of a portion of the switchable slow-wave ground plane 232, according to some embodiments of the present disclosure. FIG. 3C illustrates an expanded view 340 of a portion of the switchable reference ground plane 212, according to some embodiments of the present disclosure. FIG. 4 is a top view of the TTD phase shifter structure 200, according to some embodiments of the present disclosure. FIG. 5 is another top view of TTD phase shifter structure 200, according to some embodiments of the present disclosure. The TTD phase shifter structure 200 may be part of an integrated circuit device (e.g., a semiconductor device). In some instances, the TTD phase shifter structure 200 may be part of a multi-bit phase shifter. In some instances, the TTD phase shifter structure 200 may be part of a radio frequency (RF) device (e.g., the phased array system 700 of FIG. 7). For simplicity, FIG. 2A illustrates the TTD phase shifter structure 200 including two switchable ground planes 212 and 232 to provide two different output delay states or modes (e.g., a reference state or reference mode and a delayed state or delayed mode). However, the TTD phase shifter structure 200 can be scaled to include any suitable number of switchable ground plane (e.g., 3, 4 or more) to provide various delays.

Referring to FIG. 2A, the cross-sectional view is taken along the axis 301 of FIG. 3. The TTD phase shifter structure 200 may include a plurality of conductive layers (e.g., metal layers) arranged vertically above or under one another. For simplicity, FIG. 2A illustrates the TTD phase shifter structure 200 including four layers 210, 220, 230, and 240 shown as M1, M2, M3, and M4, respectively. However, the TTD phase shifter structure 200 may include any suitable number of layers (e.g., 3, 5, 6, 7, 8 or more). As shown, the TTD phase shifter structure 200 may further include a signal line 242 disposed on the layer 240, a switchable slow-wave ground plane 232 disposed on the layer 230, and a switchable reference ground plane 212 disposed on the layer 210. The TTD phase shifter structure 200 may further include ground elements 234a and 234b disposed on the layer 230, ground elements 224a and 224b disposed on the layer 220, and ground elements 214a and 214b disposed on the layer 210, where the ground elements 234, 224, and 214 may be interconnected with each other by vias 206. The ground elements 234, 224, and 214 are fixed ground elements that are arranged, for example, at the edges of corresponding layers of the TTD phase shifter structure 200 (shown in FIG. 3). That is, the ground elements 234, 224, and 214 are always in a ground state during operations of the TTD phase shifter structure 200. The TTD phase shifter structure 200 may further include switches 250a and 250b (shown as S1) disposed on the layer 230 and switches 252a and 252b (shown as switch S2) disposed on the layer 210. In some aspects, the layer 220 may include other traces and/or components but unrelated to the reference or delay mode, and hence are not shown for simplicity. In some aspects, the layer 240 including the signal line 242 may further include ground elements similar to the ground elements 234, 224, and 214 but unrelated to the reference mode or delayed mode, and hence are not shown for simplicity.

The switches 250 and 252 are implemented as FETs. As shown, each of the switches 250a and 250b may be coupled between the switchable slow-wave ground plane 232 and a respective ground element 234a or 234b. More specifically, the source terminal of each of the FETs 250a and 250b may be coupled to the ground element 234a and 234b, respectively, and the drain terminal of each of the FETs 250a and 250b may be coupled to the switchable slow-wave ground plane 232. The gate terminals of the FETs 250a and 250b are controlled by a first control signal 202 (shown as Vctrl). For instance, each switch 250a, 250b may be switched on when the respective gate terminal receives a logic high (e.g., Vctrl is a logic high) and may be switched off when the respective gate terminal receives a logic low (e.g., Vctrl is a logic low). In a similar way, each of the switches 252a and 252b may be coupled between the switchable reference ground plane 212 and a respective ground element 214a or 214b. More specifically, the source terminal of each of the FETs 252a and 252b may be coupled to the ground elements 234a and 234b, respectively, and the drain terminal of each of the FETs 252a and 252b may be coupled to the switchable reference ground plane 212. The gate terminals of the FETs 252a and 252b are controlled by a second control signal 204 (shown as Vctrl_bar). The second control signal 204 may be an inverted signal of the first control signal 202 so that one of the switchable slow-wave ground plane 232 or the switchable reference ground plane 212 may be selected at any given time.

Each of the switchable slow-wave ground plane 232 and the switchable reference ground plane 212 may be switched between a ground state or a floating state (e.g., a non-ground state) via the switches 250 and 252, respectively. For instance, when the first control signal 202 is a logic high, the switchable slow-wave ground plane 232 may be switched to a ground state and operate as a ground plane. That is, the signal line 242 may use the switchable slow-wave ground plane 232 as a ground plane (to provide a return signal path). At the same time, the second control signal 204 is a logic low (inverted from the first control signal 202), and thus the switchable reference ground plane 212 may be in a floating state. Conversely, when the first control signal 202 is a logic low, the switchable slow-wave ground plane 232 may be in a floating state. At the same time, the second control signal 204 is a logic high (inverted from the first control signal 202), and thus the switchable reference ground plane 212 may be switched to a ground state and operate as a ground plane. That is, the signal line 242 may use the switchable reference ground plane 212 as a ground plane (to provide a return signal path).

As shown, the layer 230 including the switchable slow-wave ground plane 232 is vertically below the layer 240 including the signal line 242, and the layer 210 including the switchable reference ground plane 212 is vertically below the layer 230. More specifically, the switchable slow-wave ground plane 232 is spaced apart from the signal line 242 by a distance 260, and the switchable reference ground plane 212 is spaced apart from the signal line 242 by a distance 262 greater than the distance 260. Further, each of the switchable slow-wave ground plane 232 and the switchable reference ground plane 212 may overlap with the signal line 242 to provide a return signal path when the respective ground plane is in a ground state. The overlap between the signal line 242 and the switchable slow-wave ground plane 232 or the switchable reference ground plane 212 can create a capacitive coupling. Because the signal line 242 is closer to the switchable slow-wave ground plane 232 than the switchable reference ground plane 212, a larger capacitance (e.g., parasitic capacitance) may be generated when the switchable slow-wave ground plane 232 is switched to a ground state than when the switchable reference ground plane 212 is switched to a ground state. As explained above, the speed of signal propagation may be counter-proportional to the capacitance to ground. Accordingly, an increased time delay can be provided when the signal line 242 utilizes the switchable slow-wave ground plane 232 as a ground plane instead of the switchable reference ground plane 212. Stated differently, the TTD phase shifter structure 200 may operate in the reference mode when the switchable reference ground plane 212 is in a ground state and the switchable slow-wave ground plane 232 is in a floating state. Conversely, the TTD phase shifter structure 200 may operate in the delayed mode when the switchable slow-wave ground plane 232 is in a ground state and the switchable reference ground plane 212 is in a floating state.

In some aspects, to further increase a delay difference between the switchable slow-wave ground plane 232 and the switchable reference ground plane 212, the switchable slow-wave ground plane 232 may include a slow-wave structure as will be discussed more fully below with reference to FIGS. 3A and 3B.

Additionally or alternatively, additional capacitors 254 (shown as 254a and 254b) can be arranged in parallel with the switches 252 to further enhance the time delay difference between the reference mode and the delayed mode. More specifically, the capacitor 254a can be connected between the source and drain terminals of the switch 252a, and the capacitor 254b can be connected between the source and drain terminals of the switch 252b. To better understand the enhanced time delay provided by the additional capacitors 254, FIGS. 2B and 2C provide equivalent models of the TTD phase shifter structure 200.

FIG. 2B illustrates the equivalent model of the TTD phase shifter structure 200 of FIG. 2A operating in a reference mode. In the reference mode, the switches 250a and 250b are switched off to decouple the switchable slow-wave ground plane 232 from the ground elements 234 while the switches 252a and 252b are switched on to couple the switchable reference ground plane 212 to the ground elements 214. As shown in FIG. 2B, the switches 250a and 250b in an off-state may be modelled (e.g., lumped circuitry equivalent) as capacitors $C_{off1}$, and the switches 252a and 252b in an on-state may be modelled as resistors $R_{on2}$. The resistors $R_{on2}$ may have a very small resistance and thus can be neglected. The capacitors 254a and 254b connected in parallel with the switches 252a and 252b may be represented by $C_{added}$. As further shown in FIG. 2B, the TTD phase shifter structure 200 may have a parasitic capacitance $C_{slow}$ between the signal line 242 and the switchable slow-wave ground plane 232 and another parasitic capacitance $C_{ref}$ between the signal line 242 and the switchable reference ground plane 212. The total parasitic capacitance at the signal line 242 may be $C_{slow}$ in series with $C_{off1}$ and further in parallel with $C_{ref}$. As such, the total capacitance at the signal line 242 in the reference mode may represented as shown below:

$$\frac{1}{\frac{1}{C_{slow}} + \frac{1}{2 \times C_{off1}}} + C_{ref}. \tag{1}$$

FIG. 2C illustrates the equivalent model of TTD phase shifter structure 200 of FIG. 2A operating in a delayed mode. In the delayed mode, the switches 250a and 250b are switched on to couple the switchable slow-wave ground plane 232 to the ground elements 234 while the switches 252a and 252b are switched off to decouple the switchable reference ground plane 212 from the ground elements 214. As shown in FIG. 2C, the switches 250a and 250b in an on-state may be modelled as resistors $R_{on1}$, and the switches 252a and 252b in an off-state may be modelled as capacitors $C_{off2}$. The resistors $R_{on2}$ may have a very small resistance and thus can be neglected. Similar to FIG. 2B, the TTD phase shifter structure 200 may have a parasitic capacitance $C_{slow}$ between the signal line 242 and the switchable slow-wave ground plane 232 and another parasitic capacitance $C_{ref}$ between the signal line 242 and the switchable reference ground plane 212. The total parasitic capacitance at the signal line 242 may be $C_{ref}$ in series with the parallel connected $C_{off1}$ and $C_{added}$ and further in parallel with $C_{slow}$. As such, the total capacitance at the signal line 242 in the delayed mode may represented as shown:

$$\frac{1}{\frac{1}{C_{ref}} + \frac{1}{2 \times (C_{off2} + C_{added})}} + C_{slow}. \tag{2}$$

As can be observed from equation (2), by adding a $C_{added}$ in parallel with the switch 252a and a $C_{added}$ in parallel with the switch 252b, the overall value of $C_{ref}$ in series with ($C_{off2}$+ $C_{added}$) is increased. As explained above, the higher the capacitance, the slower the signal propagation speed. Accordingly, the addition of the capacitors 254a and 254b (e.g., $C_{added}$) to the TTD phase shifter structure 200 can enhance the time delay for the delayed mode.

While FIG. 2A illustrates the switches 250 and 252 implemented using negative-positive-negative (NPN) transistors, the switches 250 and 252 can be implemented using any suitable types of transistors such as positive-negative-positive (PNP) transistors, metal-oxide-semiconductor (MOS) devices, and/or complementary-metal-oxide-semiconductor (CMOS) devices. Further, while FIG. 2A illustrates one layer 220 between the switchable slow-wave ground plane 232 and the switchable reference ground plane 212, the switchable slow-wave ground plane 232 and the switchable reference ground plane 212 may be separated by any suitable number of conductive layers (e.g., 2, 3 or more) and may be arranged on any suitable layers of the TTD phase shifter structure 200. In the case where the TTD phase shifter structure 200 includes more than two layers with switchable ground planes (e.g., to provide a reference mode with multiple different delayed modes), the TTD phase shifter structure 200 may include switches that can be controlled to select a single one of the switchable ground planes to operate as a ground plane at any given time.

FIG. 3A provides a perspective view of the TTD phase shifter structure 200 and a more detailed view of the switchable slow-wave ground plane 232 and the switchable reference ground plane 212. Details unrelated to the reference mode and delayed mode are not shown for simplicity.

As shown in FIG. 3A, the layers 210, 220, 230, and 240 are vertically stacked along the z-axis. The signal line 242 may extend in a direction along the x-axis. As explained above, the switchable slow-wave ground plane 232 can include a slow-wave structure (where an expanded view is shown FIG. 3B) to further increase a delay difference between the switchable slow-wave ground plane 232 and the switchable reference ground plane 212. To that end, the switchable slow-wave ground plane 232 may be a conductive plane that includes a first elongated conductive segment 302 and a second elongated conductive segment 304 each extending in a direction along the x-axis, and a plurality of elongated conductive segments 306 spaced apart from each other (e.g., about parallel to each other) and extending in a direction along the y-axis, where opposite ends of the plurality of conductive segments 306 are each connected to a different one of the first conductive segment 302 or the second conductive segment 304, for example, in a "ladder" configuration. Further, the conductive segments 306 are at least partially overlapping with the signal line 242 (e.g., directly below the signal line 242). That is, each of the conductive segments 306 may cross the signal line 242 to provide the further delay. As an example, a signal 310 (e.g., a current signal) received at an input port 312 may travel along the signal line 242 from the input port 312 to the output port 314 along a signal propagation axis 303. When the switchable slow-wave ground plane 232 is switched to a ground state to operate as a ground plane (e.g., by activating the switches 250), a returned signal (e.g., a return current) may travel along the segments 306 (of the switchable slow-wave ground plane 232) from one direction to another along a signal propagation axis 305, for example, in a "zig-zag" manner as shown in FIG. 3B. For instance, the returned signal may travel in a first direction along a first conductive segment 306, then in a second, opposite direction along a second conductive segment 306 adjacent to the first conductive segment 306, and so on as shown by the dashed arrows in FIG. 3B to provide an additional level of delays. Accordingly, utilizing the slow-wave structure for the switchable slow-wave ground plane 232 can increase the delay using the same die area.

As further shown in FIG. 3A, the switchable reference ground plane 212 may include a conductive plane (e.g., a metal sheet) with holes (or cut-outs) 308, for example, arranged in a grid pattern as shown. However, the conductive plane can include holes arranged in any suitable pattern or without holes depending on the process and/or allowable density for the conductive plane, for example. The conductive plane may be arranged to be overlapping with the signal line 242 provide a return signal path, which is shown by the dashed arrow in the expanded view 340 of FIG. 3C. As can be observed, the return signal path being a straight path (in a reverse direction of the signal path along the signal line 242 from the input port 312 to the output port 314) can provide a shorter delay compared to the zig-zag return signal path of the switchable slow-wave ground plane 232 shown in FIG. 3B.

As further shown in FIG. 3A, the layer 230 further includes two additional switches 250 (shown as 250c and 250d) coupled between the switchable slow-wave ground plane 232 and the ground elements 234. Similarly, the layer 210 further includes two additional switches 252 (shown as 252c and 252d) coupled between the switchable reference ground plane 212 and the ground elements 214. In general, each of the layers 230 or 210 may include any suitable number of respective switches 250 or 252 (e.g., about 3, 5, or more) arranged in any suitable locations on the respective layers 230 or 210. Additionally, while the ground elements 234 are shown as ground lines or strips arranged at the edges of the layer 230, the ground elements 234 can be arranged in any suitable configuration on the layer 230 (e.g., three edges or all four edges). Similarly, while the ground elements 214 are shown as ground lines or strips arranged at the edges of the layer 210, the ground elements 214 can be arranged in any suitable configuration on the layer 210 (e.g., three edges or all four edges). Further, additional capacitors 254c and 254d may be connected in parallel to the switches 252c and 252d, respectively. While FIG. 3A illustrates that each of the switches 252 is connected in parallel with a respective capacitor 254, in some instances, one or more of the switches 252 may not have a capacitor 254 connected in parallel.

In some aspects, the switches 250 and 252 can be sized to achieve a small insertion loss variation between the reference mode and the delayed mode. For instance, the switches 250 (S1) for selective coupling of the switchable slow-wave ground plane 232 to the ground elements 234 and 235 can have a smaller size than the switches 252 (S2) for selective coupling of the switchable reference ground plane 212 to the ground elements 214. In some aspects, the switches 250 and the switches 252 may be arranged on their respective layers 230 and 210 such that the switches 250 and the switches 252 are at least partially overlapping or non-overlapping or aligned with each other vertically.

FIG. 4 shows a top view of the TTD phase shifter structure 200. FIG. 4 illustrates the layer 240 including the signal line 242 and the layer 230 including the switchable slow-wave ground plane 232 but without the layers 210 and 220 to avoid cluttering the figure. As shown, the signal line 242 extends in a direction of the x-axis from the input port 312 to the output port 314 with a signal propagation axis 303, while the slow-wave structure of the switchable slow-wave ground plane 232 may include a signal propagation axis 305 that is about perpendicular to the signal propagation axis 303.

FIG. 5 shows a top view of the TTD phase shifter structure 200. FIG. 5 illustrates the layer 240 including the signal line 242 and the layer 210 including the switchable reference ground plane 212 but without the layers 220 and 230 to avoid cluttering the figure. As shown, the signal line 242 may have a signal propagation axis 303. As discussed above with reference to FIGS. 3A and 3C, the switchable reference ground plane 212 may provide a return signal path in a reverse direction of the signal path along the signal line 242 from the input port 312 to the output port 314. For instance, a signal (a current signal) may travel along the signal line 242 from the input port 312 to the output port 314, and a return signal (return current) may travel along the switchable reference ground plane 212 in the reverse direction as shown by the dashed arrow.

Example Multi-Bit Phase Shifter

Figure 6:
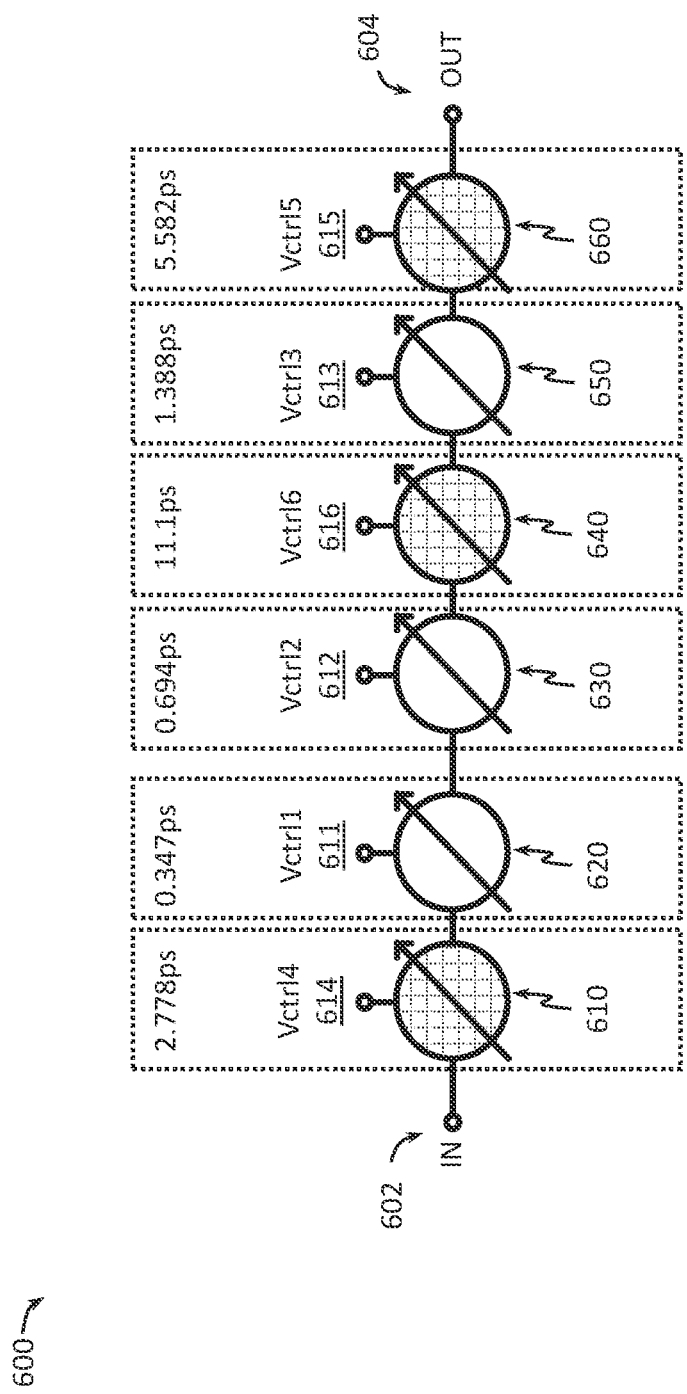
FIG. 6 is schematic diagram illustrating an exemplary multi-bit TTD phase shifter, according to some embodiments of the present disclosure.

FIG. 6 is schematic diagram illustrating an exemplary multi-bit TTD phase shifter circuitry 600, according to some embodiments of the present disclosure. The multi-bit TTD phase shifter circuitry 600 may be part of an integrated circuit device. In some instances, the multi-bit TTD phase shifter circuitry 600 may be part of an RF device (e.g., the phased array system 700 of FIG. 7).

As shown, the multi-bit TTD phase shifter circuitry 600 may include an input node 602, an output node 604, and a plurality of adjustable or switchable phase shifter circuities 610, 620, 630, 640, 650, and 660 connected in series between the input node 602 and the output node 604. Each of the phase shifter circuities 610, 620, 630, 640, 650, and 660 may provide a different delay (and hence a different phase-shift) responsive to a respective control signal or control bit. For instance, the phase shifter circuitry 610 may be configured to provide a delay of about 2.778 picosecond (ps) based on a control signal 614 (shown as Vctrl4) being a logic high or a logic low, respectively, or vice versa. The phase shifter circuitry 620 may be configured to provide a delay of about 0.347 ps based on a control signal 611 (shown as Vctrl1) being a logic high or a logic low, respectively, or vice versa. The phase shifter circuitry 630 may be configured to provide a delay of about 0.694 based on a control signal 616 (shown as Vctrl2) being a logic high or a logic low, respectively, or vice versa. The phase shifter circuitry 640 may be configured to provide a delay of about 11.1 ps based on a control signal 616 (shown as Vctrl6) being a logic high or a logic low, respectively, or vice versa. The phase shifter circuitry 650 may be configured to provide a delay of about 1.388 ps based on a control signal 613 (shown as Vctrl3) being a logic high or a logic low, respectively, or vice versa. The phase shifter circuitry 660 may be configured to provide a delay of about 5.582 ps based on a control signal 615 (shown as Vctrl5) being a logic high or a logic low, respectively, or vice versa. Accordingly, the multi-bit TTD phase shifter circuitry 600 can provide up to a delay of about 21.88 picosecond (ps), which may correspond to about 354.375 degrees at 45 GHz.

In some aspects, the multi-bit TTD phase shifter circuitry 600 may utilize a combination of the switchable ground plane topology as discussed above with reference to FIGS. 2, 3A-3C, and 4-5 and the switched transmission line topology as discussed above with reference to FIG. 1 in the phase shifter circuities 610, 620, 630, 640, 650, and 660. The reason for using a combination of the switchable ground plane topology and the switched transmission line topology is that the switched transmission topology may have too high of an insertion loss for small-delay cells while transmission lines with switchable ground planes have too high of an insertion loss for large time-delay cells. To that end, the phase shifter circuities 610, 640, and 660 (shown by the patterned circles) with the higher delays can be implemented using the switched transmission line topology, while the phase shifter circuities 620, 630, and 650 (shown by the empty-filled circles) with the lower delays can be implemented using the switchable ground plane topology. Accordingly, combining the switchable ground plane topology with the switched transmission line topology can provide the multi-bit TTD phase shifter circuitry 600 with an optimal insertion loss.

In some aspects, each of the control signals 611, 612, 613, 614, 615, and 616 may be generated according to a separate control bit of a control word (e.g., with bits b0, b1, b2, b3, b4, and b5) for configuring the multi-bit TTD phase shifter circuitry 600. As an example, the control signals 611, 612, 613, 614, 615, and 616 may each be controlled by b0, b1, b2, b3, b4, and b5, respectively. A control signal 611, 612, 613, 614, 615, or 616 may be set to a logic high when a corresponding bit is 1 and may set to a logic low when the corresponding bit is 0, or vice versa. In some aspects, the phase shifter circuities 610, 620, 630, 640, 650, and 660 may be arranged in an order based on the insertion loss and/or a return loss of the individual circuit blocks. However, in general, the phase shifter circuities 610, 620, 630, 640, 650, and 660 may be arranged in any suitable order and corresponding control signals 615, 611, 616, 613, 612, and 614 may be mapped to any suitable bits of the control word.

In operation, the phase shifter circuitry 600 may receive an input signal at the input node 602. The input signal may be delayed (or phase-shifted) by one or more of the phase shifter circuities 610, 620, 630, 640, 650, and 660 depending on whether each of the control signals 611, 612, 613, 614, 615, or 616 is a logic high or a logic low, respectively. The phase shifter circuitry 600 may output an output signal at the output node 604, where the output signal may correspond to a time-delayed version (or phase-shifted version) of the input signal.

While FIG. 6 illustrates the multi-bit phase shifter circuitry 600 as a 6-bit phase shifter including six phase shifter circuities 610, 620, 630, 640, 650, and 660 controlled by a 6-bit control word, aspects are not limited thereto. In general, a multi-bit phase shifter may include any suitable number of phase shifter circuities (e.g., 4, 5, 7, 8 or more) and may use any suitable combinations of switched transmission topology and switchable ground plane topology.

Example Phased Array System

Figure 7:
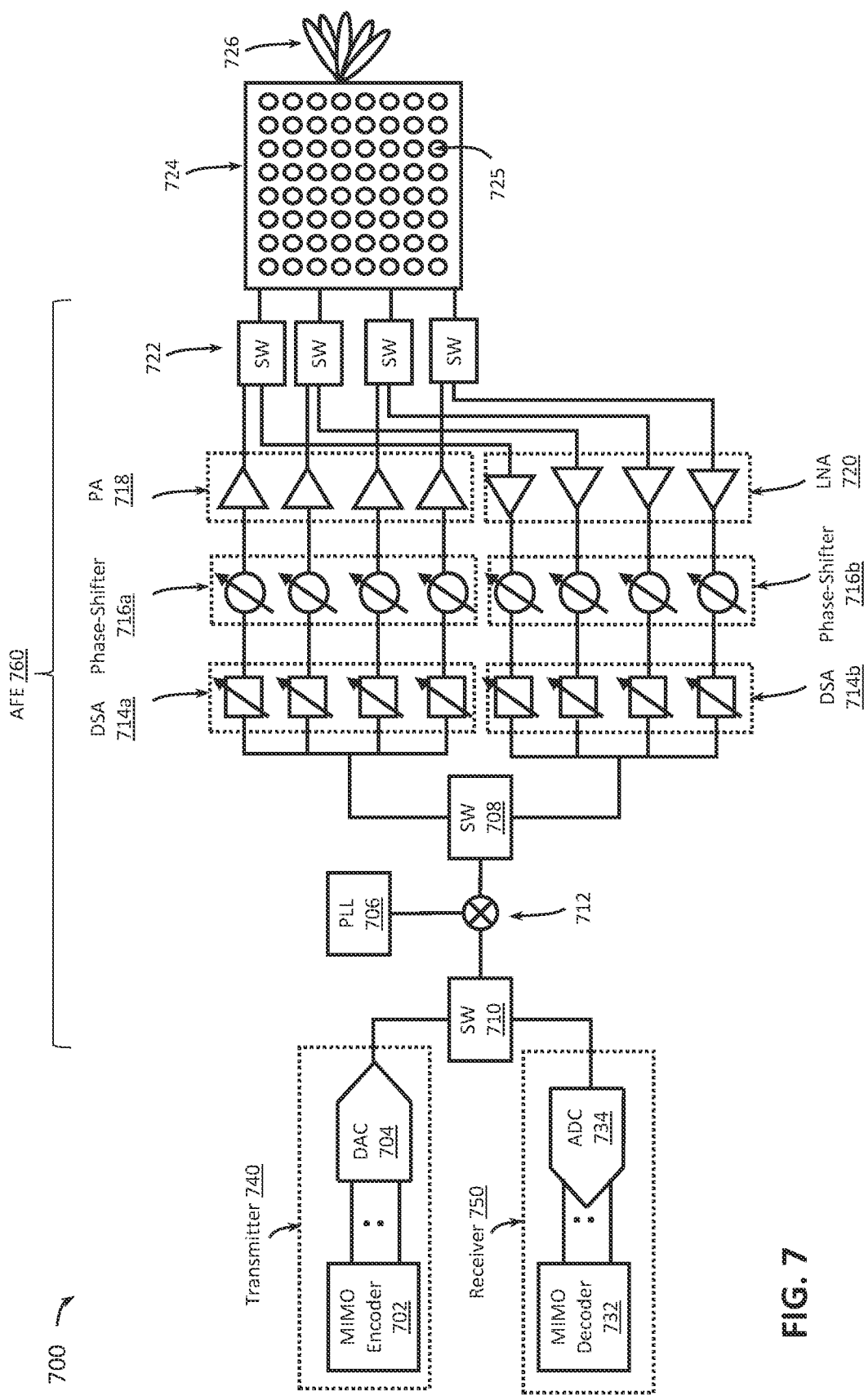
FIG. 7 is a block diagram illustrating an exemplary phased array system, according to some embodiments of the present disclosure.

FIG. 7 is a block diagram illustrating an exemplary phased array system 700, according to some embodiments of the present disclosure. The phased array system 700 may be part of an RF system. In some instances, the phase shifter circuitry may correspond to a portion of a wireless communication device. In other instances, the phased array system 700 may correspond to a portion of a base station. The phased array system 700 may operate in any suitable frequency range. In some aspects, the phased array system 700 may operate over a Ku band and/or a Ka band.

As shown, the system 700 may include a transmitter 740, a receiver 750, an analog frontend (AFE) 760, and an antenna array 724. The transmitter 740 may include a multiple-input and multiple-output (MIMO) encoder 702 and a digital-to-analog converter (DAC) 704. The receiver 750 may include a MIMO decoder 732 and an analog-to-digital converter (ADC) 734. The AFE 760 may include a switch 710 (shown as SW), a multiplier 712, a phase-locked loop (PLL) 706, another switch 708 (shown as SW), a plurality of digital step attenuators (DSAS) 714 (shown as 714a and 714b), a plurality of phase shifters 716 (shown as 716a and 716b), a plurality of power amplifiers (PAs) 718, a plurality of low-noise amplifiers (LNAs) 720, and a plurality of switches 722 (shown as SW). The MIMO encoder 702 and the MIMO decoder 732 may be implemented using a combination of hardware and/or software. The rest of the components in the system 700 may be implemented in hardware and at least some of the component can be controlled by software.

In a transmit direction, the MIMO encoder 702 may generate a plurality of data streams (e.g., about 2, 4, 8, 16 or more). The DAC 704 may be coupled to the MIMO encoder and may convert the data streams into analog signals for transmission. The switch 710 may switch between the transmitter 740 and the receiver 750. The multiplier 712 may multiply (or mix) the transmit analog signals with a PLL signal generated by the PLL 706. The switch 708 may be selected to couple the output signal of the multiplier 712 to the DSAs 714a. The DSAs 714a may be programmed to various attenuation steps to attenuate corresponding signals. The phase shifters 716a may each be coupled to one of the DSAs 714a and controlled to shift the phase of a corresponding signal by a certain phase-shift (by delaying a corresponding signal, e.g., by, 0.347 ps, 0.694 ps, 1.388 ps, etc.). In some aspects, the phase shifter 716a may be similar to the multi-phase shifter circuitry 600 discussed above with reference to FIG. 6. In some aspects, at least one of the phase shifters 716a may be implemented using the switchable ground plane topology discussed above with reference to FIGS. 2, 3A-3C, and 4-5. The PAs 718 may each be coupled to one of the phase shifters 716a to amplify a corresponding phase-shifted signal for transmission. In some aspects, the DSAs 714a, the phase shifters 716a, and the PAs 718 may be configured together to beamform in a certain spatial direction for transmission. The switches 722 may be selected to couple the phase-shifted signals to the antenna array 724 for transmission. The antenna array 724 may include a plurality of antenna elements 725 (e.g., arranged in a plurality of rows and a plurality of columns as shown). The antenna array 724 may include any suitable number of antenna elements (e.g., 4, 8, 16, 64, 128, 1024 or more). Each antenna element 725 may be configured to transmit a signal with a different phase-shift (e.g., from the phase shifters 716a) to achieve beamforming in a certain spatial direction. For instance, the antenna array 724 may transmit a signal carried in any one of the beams 726.

In a receive direction, a signal may be received by the antenna array 724 via the antenna elements 725. The switches 722 may be selected to couple various antenna elements 725 to the LNAs 720. The LNAs 720 may amplify the received signals. The phase shifters 716b may be substantially similar to the phase shifters 716a and may apply various phase shifts (or time delays) to the received signals. Similarly, The DSAs 714b may be substantially similar to the DSAs 714a and may each be coupled to one of the phase shifters 716b to provide signal attenuations. In some aspects, the DSAs 714b, the phase shifters 716b, and the LNAs 720 may be configured together to beamform in a certain spatial direction for reception, for example, to receive a signal using any one of the beams 726. The switch 708 may be selected to couple the received signals to the multiplier 712 for mixing with a PLL signal generated by the PLL 706. The SW 710 can be selected to couple the received signals to the receiver 750. At the receiver 750, the ADC 734 may convert the received signal from an analog domain to a digital domain. The MIMO decoder 732 may be coupled to the ADC 734 and may decode information from the received digital signals (e.g., about 2, 4, 8, 16 or more).

In some aspects, the DSAs 714a and 714b, the phase shifters 716a and 716b, the PAs 718, and the LNAs 720 may be integrated onto a single integrated circuit device, for example, for transmit beamforming and/or receive beamforming.

While FIG. 7 illustrates four transmit paths (e.g., each including a DSA 714a, a phase shifter 716a, and a PA 718) and four receive paths (e.g., each including a DSA 714b, a phase shifter 716b, and an LNA 720) in the system 700, a phased array system can include any suitable number of paths. In some examples, a phase array system may include 2, 8, 16 or more paths for transmission and 2, 8, 16 or more paths for reception. Since each transmit path or each receive path may include a phase shifter, using the switchable ground plane topology for at least some of the phase shifters 716a and/or 716b disclosed herein can advantageously reduce the size of a phased array system or a beamforming integrated device.

Example Phase-Shifting Method

Figure 8:
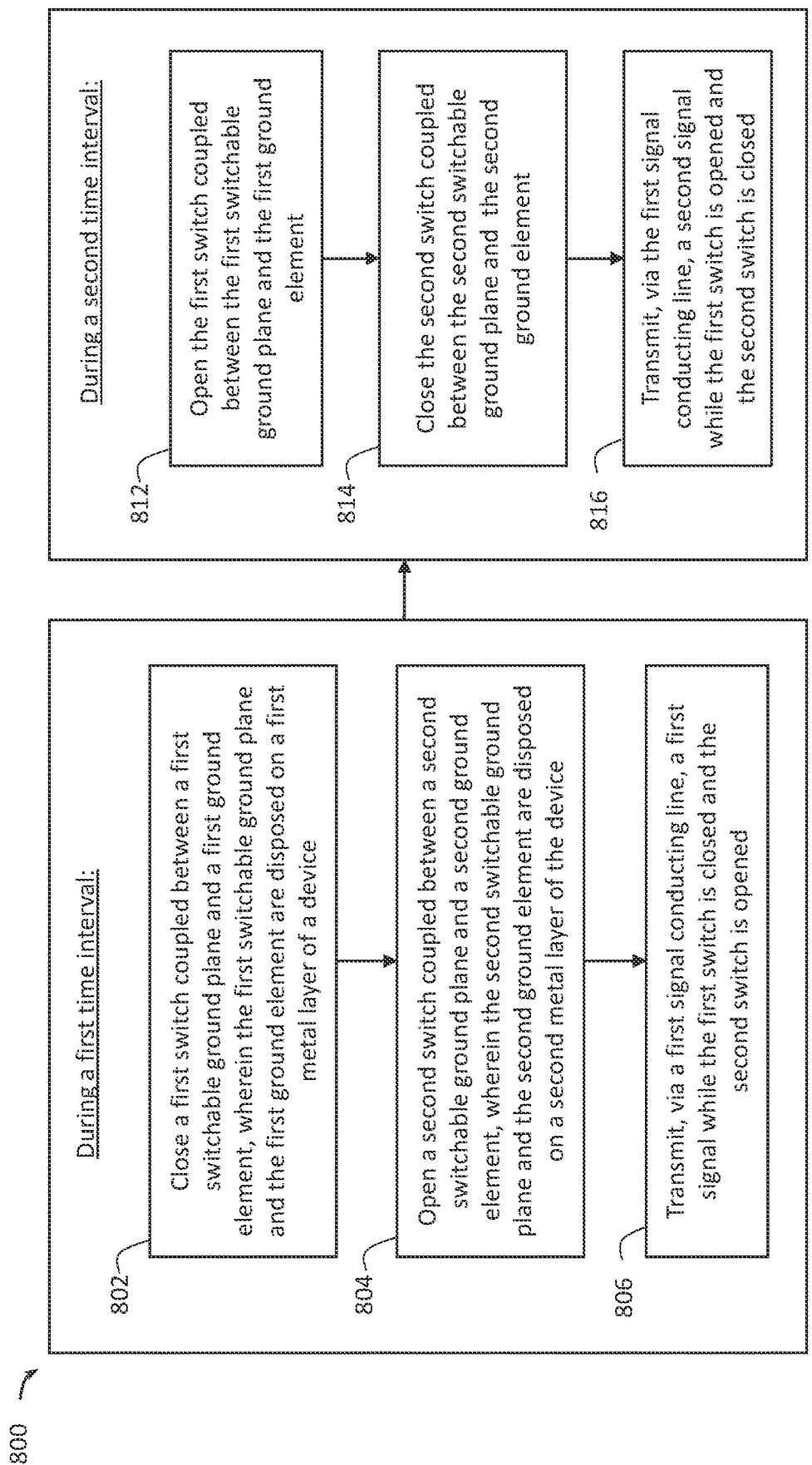
FIG. 8 is a flow diagram of a method for performing phase-shifting, according to some embodiments of the present disclosure.

FIG. 8 is a flow diagram of a method 800 for performing phase-shifting, according to some embodiments of the present disclosure. The method 800 can be implemented by phase circuitries having a structure similar to the TTD phase shifter structure 200 discussed above with reference to FIGS. 2, 3A-3C, and 4-5, respectively, multi-phase shifter circuitry similar to the multi-bit phase shifter circuitry 600 discussed above with reference to FIG. 6, and/or a phase array system similar the phased array system 700 discussed above with reference to FIG. 7, and/or any suitable wireless device. Although the operations of the method 800 may be illustrated with reference to particular embodiments of the phase shifter circuitries disclosed herein, the method 800 may be performed using any suitable hardware components and/or software components. Operations are illustrated once each and in a particular order in FIG. 8, but the operations may be performed in parallel, reordered, and/or repeated as desired.

During a first time interval, the method 800 may perform the operations of 802, 804, and 806 to switch one switchable ground plane (e.g., a first switchable ground plane) to a ground state and another switchable ground plane (e.g., a second switchable ground plane) to a floating state. For instance, at 802, a first switch coupled between the first switchable ground plane and a first ground element may be closed, wherein the first switchable ground plane and the first ground element are disposed on a first metal layer of a device. In a first example, the first switch may correspond to one of the switches 250, the first switchable ground plane may correspond to the switchable slow-wave ground plane 232, and the first metal layer may correspond to the layer 230. In a second example, the first switch may correspond to one of the switches 252, the first switchable ground plane may correspond to the switchable reference ground plane 212, and the first metal layer may correspond to the layer 210.

At 804, a second switch coupled between the second switchable ground plane and a second ground element may be opened, where the second switchable ground plane and the second ground element are disposed on a second metal layer of the device. In the first example, the second switch may correspond to one of the switches 252, the second switchable ground plane may correspond to the switchable reference ground plane 212, and the first metal layer may correspond to the layer 210. In the second example, the second switch may correspond to one of the switches 250, the second switchable ground plane may correspond to the switchable slow-wave ground plane 232, and the first metal layer may correspond to the layer 230.

At 806, a first signal may be transmitted via a first signal conductive line while the first switch is closed and the second switch is opened, wherein the first signal conductive line is disposed on a third metal layer of the device. The first, second, and third metal layers may be spaced apart from each other (e.g., vertically). In the first or second example, the first signal conductive line may correspond to the signal line 242, and the third metal layer may correspond to the layer 240.

During a second time interval different from the first time interval, the method 800 may perform the operations of 812, 814, and 816 to switch the other switchable ground plane (e.g., the second switchable ground plane) to a ground state. For instance, at 812, the first switch coupled between the first switchable ground plane and the first ground element may be opened.

At 814, the second switch coupled between the second switchable ground plane and the second ground element may be closed.

At 816, a second signal may be transmitted via the first signal conducting line while the first switch is opened and the second switch is closed.

In some aspects, the closing the first switch at 802 and opening the second switch at 804 may be based on (or responsive to) a first control bit value associated with a first transmission delay, and the opening the first switch at 812 and closing the second switch at 814 may be based on (or responsive to) a second control bit value associated with a second transmission delay different from the first transmission delay.

In some aspects, the first switchable ground plane is between the first signal conducting line and the second switchable ground plane. That is, the first signal conductive line may be closer to the first switchable ground plane than the second switchable ground plane. As explained above, the switchable ground plane closer to the signal line may generate a larger capacitance, and hence may slow down a signal propagation speed. To further increase the delay, the first switchable ground plane may include a first elongated conductive segment coupled to the first switch, a second elongated conductive segment, and a plurality of elongated conductive segments spaced apart from each other, where opposite ends of each of the plurality of elongated conductive segments are each connected to a different one of the first elongated conductive segment or the second elongated conductive segment. For instance, the first elongated conductive segment may correspond to one of the conductive segments 302 or 304, the second elongated conductive segment may correspond to the other conductive segment 302 or 304, and the plurality of spaced apart conductive segments may correspond to the conductive segments 306 discussed above with reference to FIGS. 3A, 3B, and 4.

In some aspects, the device may be multi-bit phase shifter similar to the multi-bit TTD phase shifter circuitry 600 utilizing a combination of a switched transmission line topology and a switchable ground plane topology as discussed above with reference to FIG. 6. As such, the method 800 may further include closing a third switch to couple the first signal conducting line to a second signal conducting line. The method 800 may further include opening a fourth switch to decouple the first signal conducting line from a third signal conducting line, where the third signal conducting line and the second signal conducting line have different lengths. The method 800 may further include transmitting first signal further, via the second signal conducting line while the third switch is closed and the fourth switch is opened, the first signal. For example, the third switch may correspond to one of the switches 114 or 124, the fourth switch may correspond to the other one of the switches 114 or 124, the second signal conductive line may correspond to one of the transmission lines 110 or 120, and the third signal conductive line may correspond to the other one of the transmission lines 110 or 120. In some aspects, the closing the first switch and opening the second switch may be based on a first control bit, and the closing the third switch and opening the fourth switch is based on a second control bit separate from the first control bit.

In some aspects, the first time interval during which the operations of 802, 804, and 806 are performed and the second time interval during which the operations of 812, 814, and 816 are performed may correspond to different radio frames, different subframes, or different time slots (e.g., in the context of LTE or 5G). For instance, the first signal may carry first data information (e.g., first encoded data bits) in the first time interval, and the second signal may carry second data information (e.g., second encoded data bits) in the second time interval. In some instances, the first data information can be different from the second data information. In some other instances, the first data information can be the same as the second data information, where the second signal is a retransmission of the first data information.

EXAMPLES

Example 1 includes a true time-delay (TTD) phase shifter structure. The TTD phase shifter structure includes a signal conductive line disposed on a first layer of the structure; a first switchable ground plane including a first conductive plane disposed on a second layer of the structure; a second switchable ground plane including a second conductive plane disposed on a third layer of the structure, where the first, second, and third layers are separate layers of the structure; a first switch coupled between the first switchable ground plane and a first ground element, the first ground element disposed on the second layer; and a second switch coupled between the second switchable ground plane and a second ground element, the second ground element disposed on the third layer.

Example 2 includes the TTD phase shifter structure of Example 1, where the first switchable ground plane and the second switchable ground plane are associated with different transmission delays.

Example 3 includes the TTD phase shifter structure of any of Examples 1-2, where each of the first switchable ground plane and the second switchable ground plane at least partially overlaps with the signal conductive line.

Example 4 includes the TTD phase shifter structure of any of Examples 1-3, where the first switchable ground plane is between the signal conductive line and the second switchable ground plane; and the first conductive plane of the first switchable ground plane includes a first elongated conductive segment coupled to the first switch; a second elongated conductive segment; and a plurality of elongated conductive segments spaced apart from each other, where opposite ends of each of the plurality of elongated conductive segments are each connected to a different one of the first elongated conductive segment or the second elongated conductive segment.

Example 5 includes the TTD phase shifter structure of any of Examples 1-4, where a signal propagation axis of the signal conductive line is non-parallel with a signal propagation axis of the plurality of elongated conductive segments of the first switchable ground plane.

Example 6 includes the TTD phase shifter structure of any of Examples 1-5, where a signal propagation axis of the signal conductive line is perpendicular to a signal propagation axis of the plurality of elongated conductive segments of the first switchable ground plane.

Example 7 includes the TTD phase shifter structure of any of Examples 1-6, where the signal conductive line at least partially overlaps with the plurality of elongated conductive segments of the first switchable ground plane.

Example 8 includes the TTD phase shifter structure of any of Examples 1-7, where the second conductive plane of the second switchable ground plane includes a layer of conductive material with holes.

Example 9 includes the TTD phase shifter structure of any of Examples 1-8 and further includes one or more conductive layers between the first switchable ground plane and the second switchable ground plane.

Example 10 includes the TTD phase shifter structure of any of Examples 1-9, where the first switch is in a closed state to switch the first conductive plane to a ground state while the second switch is in an opened state to switch the second conductive plane to a floating state.

Example 11 includes the TTD phase shifter structure of any of Examples 1-10, where the first switch is in an opened state to switch the first conductive plane to a floating state while the second switch is in a closed state to switch the second conductive plane to a ground state.

Example 12 includes the TTD phase shifter structure of any of Examples 1-12, where the first switch coupled between the first switchable ground plane and the first ground element has a different size than the second switch coupled between the second switchable ground plane and the second ground element.

Example 13 includes the TTD phase shifter structure of any of Examples 1-13, where the second switchable ground plane is spaced apart from the signal conductive line by a greater distance than the first switchable ground plane; the second switch coupled between the second switchable ground plane and the second ground element includes a field effect transistor (FET); and the TTD phase shifter structure further includes a capacitor coupled across a drain and a source of the FET.

Example 14 an integrated circuit device including a first metal layer including a first signal conductive line; a second metal layer including a first ground plane switchable between a respective ground state and a respective floating state, where the second metal layer is vertically below the first metal layer; a third metal layer including a second ground plane switchable between a respective ground state and a respective floating state, where the third metal layer is vertically below the second metal layer; and a plurality of switches to selectively switch one of the first ground plane or the second ground plane to the respective ground state and the other one of the first ground plane or the second ground plane to the respective floating state.

Example 15 includes the integrated circuit device of Example 14, where the first ground plane includes a first elongated conductive segment coupled to at least a first switch of the plurality of switches; a second elongated conductive segment; and a plurality of elongated conductive segments spaced apart from each other, where a first end of each of the plurality of elongated conductive segments is connected to the first elongated conductive segment and a second end of each of the plurality of elongated conductive segments is connected to the second elongated conductive segment.

Example 16 includes the integrated circuit device of any of Examples 14-15, where a signal propagation axis of the first signal conductive line is non-parallel with a signal propagation axis of the plurality of elongated conductive segments of the first ground plane.

Example 17 includes the integrated circuit device of Example 14 and further includes one or more other metal layers between the first ground plane and the second ground plane.

Example 18 includes the integrated circuit device of any of Examples 14-17, where the second metal layer further includes a first ground element, where a first switch of the plurality of switches is coupled between the first ground plane and the first ground element; and the third metal layer further includes a second ground element, and where a second switch of the plurality of switches is coupled between the second ground plane and the second ground element.

Example 19 includes the integrated circuit device of any of Examples 14-18, where the second switch coupled between the second ground plane and the second ground element includes a field effect transistor (FET); and the integrated circuit device further includes a capacitor coupled across a drain and a source of the FET.

Example 20 includes the integrated circuit device of any of Examples 14-19, where the integrated circuit device is a multi-bit phase shifter device including a first phase shifter, where the first signal conductive line, the first ground plane, the second ground plane, and the plurality of switches are part of the first phase shifter; and a second phase shifter including a second signal conductive line and a third signal conductive line of different lengths; and one or more switches to select the second signal conductive line or the third signal conductive line.

Example 21 includes the integrated circuit device of any of Examples 14-20, where the first phase shifter is associated with a shorter transmission time delay than the second phase shifter.

Example 22 includes the integrated circuit device of any of Examples 14-21, where the first phase shifter is responsive to a first control bit; and the second phase shifter is responsive to a second control bit separate from the first control bit.

Example 23 includes a method for performing phase-shifting, the method including closing a first switch coupled between a first switchable ground plane and a first ground element, where the first switchable ground plane and the first ground element are disposed on a first metal layer of a device; opening a second switch coupled between a second switchable ground plane and a second ground element, where the second switchable ground plane and the second ground element are disposed on a second metal layer of the device; and transmitting, via a first signal conductive line, a first signal while the first switch is closed and the second switch is opened, where the first signal conductive line is disposed on a third metal layer of the device, where the first, second, and third metal layers are spaced apart from each other.

Example 24 includes the method of Example 23 and further includes opening the first switch coupled between the first switchable ground plane and the first ground element; closing the second switch coupled between the second switchable ground plane and the second ground element;

and transmitting, via the first signal conductive line, a second signal while the first switch is opened and the second switch is closed.

Example 25 includes the method of any of Examples 23-24, where the closing the first switch and opening the second switch is based on a first control bit value associated with a first transmission delay; and the opening the first switch and closing the second switch is based on a second control bit value associated with a second transmission delay different from the first transmission delay.

Example 26 includes the method of any of Examples 23-25, where the first switchable ground plane is between the first signal conductive line and the second switchable ground plane; and the first switchable ground plane includes a first elongated conductive segment coupled to the first switch; a second elongated conductive segment; and a plurality of elongated conductive segments spaced apart from each other, where opposite ends of each of the plurality of elongated conductive segments are each connected to a different one of the first elongated conductive segment or the second elongated conductive segment.

Example 27 includes the method of any of Examples 23-26 and further includes closing a third switch to couple the first signal conductive line to a second signal conductive line; opening a fourth switch to decouple the first signal conductive line from a third signal conductive line, where the third signal conductive line and the second signal conductive line have different lengths; and transmitting further, via the second signal conductive line while the third switch is closed and the fourth switch is opened, the first signal.

Example 28 includes the method of any of Examples 23-27, where the closing the first switch and opening the second switch is based on a first control bit; and the closing the third switch and opening the fourth switch is based on a second control bit separate from the first control bit.

Variations and Implementations

While embodiments of the present disclosure were described above with references to exemplary implementations as shown in FIGS. 1, 2A-2C, 3A-3C, and 4-8, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as switches, transmission lines, ground elements, conductive planes, capacitors, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to TTD phase shifters, in various communication systems.

Parts of various systems for implementing TTD phase shifters as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of phase shifters shown in FIGS. 1, 2A-2C, 3A-3C, and 4-6 and/or the phased array system shown in FIG. 7) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. A true time-delay (TTD) phase shifter structure comprising:
   a signal conductive line disposed on a first layer of the structure;
   a first switchable ground plane comprising a first conductive plane disposed on a second layer of the structure;
   a second switchable ground plane comprising a second conductive plane disposed on a third layer of the structure, wherein the first, second, and third layers are separate layers of the structure;
   a first switch coupled between the first switchable ground plane and a first ground element, the first ground element disposed on the second layer; and
   a second switch coupled between the second switchable ground plane and a second ground element, the second ground element disposed on the third layer;
   wherein the second switchable ground plane is spaced apart from the signal conductive line by a greater distance than the first switchable ground plane.

2. The TTD phase shifter structure of claim 1, wherein:
   the first switchable ground plane is between the signal conductive line and the second switchable ground plane; and
   the first conductive plane of the first switchable ground plane comprises:
   a first elongated conductive segment coupled to the first switch;
   a second elongated conductive segment; and
   a plurality of elongated conductive segments spaced apart from each other, wherein opposite ends of each of the plurality of elongated conductive segments are each connected to a different one of the first elongated conductive segment or the second elongated conductive segment.

3. The TTD phase shifter structure of claim 2, wherein a signal propagation axis of the signal conductive line is non-parallel with a signal propagation axis of the plurality of elongated conductive segments of the first switchable ground plane.

4. The TTD phase shifter structure of claim 1, wherein the second conductive plane of the second switchable ground plane comprises a layer of conductive material with holes.

5. The TTD phase shifter structure of claim 1, further comprising:
   one or more conductive layers between the first switchable ground plane and the second switchable ground plane.

6. The TTD phase shifter structure of claim 1, wherein the first switch is in a closed state to switch the first conductive plane to a ground state while the second switch is in an opened state to switch the second conductive plane to a floating state.

7. The TTD phase shifter structure of claim 1, wherein the first switch is in an opened state to switch the first conductive plane to a floating state while the second switch is in a closed state to switch the second conductive plane to a ground state.

8. The TTD phase shifter structure of claim 1, wherein the first switch coupled between the first switchable ground plane and the first ground element and the second switch coupled between the second switchable ground plane and the second ground element are different to compensate for a variation in insertion loss associated with use of the first switchable ground plane and the first ground element versus use of the second switchable ground plane and the second ground element.

9. The TTD phase shifter structure of claim 1, wherein:
the second switch coupled between the second switchable ground plane and the second ground element comprises a field effect transistor (FET); and
the TTD phase shifter structure further comprises a capacitor coupled across a drain and a source of the FET.

10. An integrated circuit device comprising:
a first metal layer comprising a first signal conductive line;
a second metal layer comprising a first ground plane switchable between a respective ground state and a respective floating state, wherein the second metal layer is vertically below the first metal layer;
a third metal layer comprising a second ground plane switchable between a respective ground state and a respective floating state, wherein the third metal layer is vertically below the second metal layer; and
a plurality of switches to selectively switch one of the first ground plane or the second ground plane to the respective ground state and another one of the first ground plane or the second ground plane to the respective floating state.

11. The integrated circuit device of claim 10, wherein the first ground plane comprises:
a first elongated conductive segment coupled to at least a first switch of the plurality of switches;
a second elongated conductive segment; and
a plurality of elongated conductive segments spaced apart from each other, wherein a first end of each of the plurality of elongated conductive segments is connected to the first elongated conductive segment and a second end of each of the plurality of elongated conductive segments is connected to the second elongated conductive segment.

12. The integrated circuit device of claim 11, wherein a signal propagation axis of the first signal conductive line is non-parallel with a signal propagation axis of the plurality of elongated conductive segments of the first ground plane.

13. The integrated circuit device of claim 10, wherein:
the second metal layer further comprises a first ground element, wherein a first switch of the plurality of switches is coupled between the first ground plane and the first ground element; and
the third metal layer further comprises a second ground element, and wherein a second switch of the plurality of switches is coupled between the second ground plane and the second ground element.

14. The integrated circuit device of claim 10, wherein the integrated circuit device is multi-bit phase shifter device comprising:
a first phase shifter, wherein the first signal conductive line, the first ground plane, the second ground plane, and the plurality of switches are part of the first phase shifter; and
a second phase shifter comprising:
a second signal conductive line and a third signal conductive line of different lengths; and
one or more switches to select the second signal conductive line or the third signal conductive line.

15. The integrated circuit device of claim 14, wherein the first phase shifter is associated with a shorter transmission time delay than the second phase shifter.

16. The integrated circuit device of claim 14, wherein:
the first phase shifter is responsive to a first control bit; and
the second phase shifter is responsive to a second control bit separate from the first control bit.

17. A method for performing phase-shifting, the method comprising:
closing a first switch coupled between a first switchable ground plane and a first ground element, wherein the first switchable ground plane and the first ground element are disposed on a first metal layer of a device;
opening a second switch coupled between a second switchable ground plane and a second ground element, wherein the second switchable ground plane and the second ground element are disposed on a second metal layer of the device; and
transmitting, via a first signal conductive line, a first signal while the first switch is closed and the second switch is opened, wherein the first signal conductive line is disposed on a third metal layer of the device,
wherein the first, second, and third metal layers are spaced apart from each other; and
wherein the second switchable ground plane is spaced apart from the first signal conductive line by a greater distance than the first switchable ground plane.

18. The method of claim 17, further comprising:
opening the first switch coupled between the first switchable ground plane and the first ground element;
closing the second switch coupled between the second switchable ground plane and the second ground element; and
transmitting, via the first signal conductive line, a second signal while the first switch is opened and the second switch is closed.

19. The method of claim 18, wherein:
the closing the first switch and opening the second switch is based on a first control bit value associated with a first transmission delay; and
the opening the first switch and closing the second switch is based on a second control bit value associated with a second transmission delay different from the first transmission delay.

20. The method of claim 17, wherein
the first switchable ground plane is between the first signal conductive line and the second switchable ground plane; and
the first switchable ground plane comprises:
a first elongated conductive segment coupled to the first switch;
a second elongated conductive segment; and
a plurality of elongated conductive segments spaced apart from each other, wherein opposite ends of each of the plurality of elongated conductive segments are each connected to a different one of the first elongated conductive segment or the second elongated conductive segment.

* * * * *